(12) United States Patent
Seemann et al.

(10) Patent No.: US 7,834,818 B2
(45) Date of Patent: Nov. 16, 2010

(54) APPARATUS FOR ATTENUATING REFLECTIONS OF ELECTROMAGNETIC WAVES, METHOD FOR ITS MANUFACTURE AND ITS USE

(75) Inventors: Klaus Seemann, Durmersheim (DE); Harald Leiste, Weingarten (DE); Viacheslav Bekker, Karlsruhe (DE); Stefan Zils, Ettlingen (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 211 days.

(21) Appl. No.: 11/914,420

(22) PCT Filed: Mar. 31, 2006

(86) PCT No.: PCT/EP2006/002934

§ 371 (c)(1),
(2), (4) Date: Nov. 14, 2007

(87) PCT Pub. No.: WO2006/122608

PCT Pub. Date: Nov. 23, 2006

(65) Prior Publication Data

US 2009/0128445 A1 May 21, 2009

(30) Foreign Application Priority Data

May 14, 2005 (DE) .................. 10 2005 022 473

(51) Int. Cl.
*H01Q 15/02* (2006.01)
(52) U.S. Cl. ...................................... 343/909; 343/787

(58) Field of Classification Search ................. 343/909, 343/872, 700 MS, 787; 216/22; 342/1, 4
See application file for complete search history.

(56) References Cited

U.S. PATENT DOCUMENTS

| 3,524,173 | A |   | 8/1970  | Wolf              |       |
|-----------|---|---|---------|-------------------|-------|
| 5,323,160 | A | * | 6/1994  | Kim et al.        | 342/1 |
| 5,872,534 | A | * | 2/1999  | Mayer             | 342/1 |
| 6,483,481 | B1|   | 11/2002 | Sievenpiper et al.|       |

(Continued)

FOREIGN PATENT DOCUMENTS

DE            1764304         8/1972

(Continued)

OTHER PUBLICATIONS

H. Okumura et al. "Magnetic and structural characterization and ferromagnetic resonance study of thin film HITPERM soft magnetic materials for data storage applications", Journal of Applied Physics, vol. 93, No. 10, May 15, 2003, pp. 6528-6530.

(Continued)

*Primary Examiner*—Tan Ho
(74) *Attorney, Agent, or Firm*—Leydig, Voit & Mayer, Ltd.

(57) ABSTRACT

A device for attenuating reflections of an electromagnetic wave impinging thereon and a method of making the device. The device includes a structured film comprised of at least one of a ferromagnetic and ferrimagnetic material. The structured film has a structure and a uniform film portion of the at least one of a ferromagnetic and ferrimagnetic material underneath the structure such that the structured film has at least two different resonance frequencies.

20 Claims, 2 Drawing Sheets

U.S. PATENT DOCUMENTS

| | | | |
|---|---|---|---|
| 6,999,279 B2* | 2/2006 | Lundstrom | 360/131 |
| 7,420,500 B2* | 9/2008 | Treen et al. | 342/4 |
| 7,551,117 B2* | 6/2009 | Asaba | 342/1 |
| 2002/0067313 A1* | 6/2002 | Kondoh et al. | 343/700 MS |

FOREIGN PATENT DOCUMENTS

| | | |
|---|---|---|
| EP | 1508917 | 2/2005 |
| WO | 9513620 | 5/1995 |

OTHER PUBLICATIONS

O. Acher et al. "Microwave permeability of ferromagnetic thin films with stripe domain structure", Journal of Applied Physics 81, Apr. 15, 1997, pp. 4057-4059.

G. Perrin et al. "Control of the resonance frequency of soft ferromagnetic amorphous thin films by strip patterning", Journal of Applied Physics 81, Apr. 15, 1997, pp. 5166-5168.

M. Vroubel et al. "Patterned FeNi thin film for RF and microwave components", Journal of Magnetism and Magnetic Materials 258-259, 2003, pp. 167-169.

* cited by examiner

APPARATUS FOR ATTENUATING REFLECTIONS OF ELECTROMAGNETIC WAVES, METHOD FOR ITS MANUFACTURE AND ITS USE

CROSS REFERENCE TO RELATED APPLICATIONS

This is a U.S. National Phase application under 35 U.S.C. §371 of International Application No. PCT/EP2006/002934, filed on Mar. 31, 2006, and claims the benefit of German Patent Application No. 10 2005 022473.3, filed on May 14, 2005. The International Application was published in German on Nov. 23, 2006 as WO 2006/122608 A1 under PCT Article 221(2).

FIELD OF THE INVENTION

The present invention relates to a device for attenuating reflections of an electromagnetic wave impinging on the same, and to a method for the manufacture and use thereof.

BACKGROUND

To shield against electromagnetic waves, simple metallic coatings of copper or aluminum are predominantly used, the wave being nearly completely reflected and its energy not being dissipated. When non-magnetic metals are used for reflecting an electromagnetic wave, there is merely a minimal loss of energy; hardly any dissipation occurs.

In the context of ferro- or ferrimagnetic resonance, magnetic films, such as FeNi foils, effect a partial absorption of the electromagnetic energy, partially converting it into other forms of energy, in particular thermal energy, thereby attenuating the wave. In this case, however, the frequency range of the energy dissipation is limited and essentially covers the low MHz and kHz range. The shielding against an electromagnetic wave can be improved as a function of the magnetic permeability; the so-called skin effect prevents the wave from penetrating more deeply into a housing. However, the inherent disadvantage is that the range of maximum energy absorption is not adjustable.

H. Okumura, D. J. Twisselmann, R. D. McMichael, M. Q. Huang, Y. N. Hsu, D. E. Laughlin and M. E. McHenry, *Magnetic and Structural Characterization and Ferromagnetic Resonance Study of Thin Film HITPERM Soft Magnetic Materials for Data Storage Applications*, J. Appl. Phys. 93, 2003, pp. 6528-30, describes a device made of one or of a plurality of layers of thin films of amorphous magnetic materials, each film having a resonance frequency.

In *Microwave Permeability of Ferromagnetic Thin Films With Stripe Domain Structure*, J. Appl. Phys. 81, 1997, pp. 4057-59, O. Acher, C. Boscher, B. Brulé, G. Perrin, N. Vukadinovic, G. Suran and H. Joisten describe a planar, amorphous ferromagnetic film having stripe domains.

G. Perrin, J. C. Peuzin, and O. Acher, in *Control of the Resonance Frequency of Soft Ferromagnetic Amorphous Thin Films by Strip Patterning*, J. Appl. Phys. 81, 1997, pp. 5166-68, and M. Vroubel, Y. Zhuang, B. Rejaei and J. Burghartz, in *Patterned FeNi Thin Film for RF and Microwave Components*, J. Magnetism and Magn. Materials 258-259, 2003, pp. 167-169, discuss applying thin, parallel strips of amorphous, ferromagnetic films to a substrate using photolithography. This allows the frequency of the ferromagnetic resonance of a film to be shifted to higher values.

SUMMARY

Against this background, an aspect of the present invention is to provide a ferro- or ferrimagnetic film and a method for the preparation and use thereof. In an embodiment, the invention provides a device for attenuating the reflection and transmission of electromagnetic waves over a broad frequency range or for discrete frequencies through the use of ferro- or ferrimagnetic thin films, and provides a method for the manufacture of the device.

In an embodiment, the present invention provides a device for attenuating reflections of an electromagnetic wave impinging thereon and a method of making the device. The device includes a structured film comprised of at least one of a ferromagnetic and ferrimagnetic material. The structured film has a structure and a uniform film portion of the at least one of a ferromagnetic and ferrimagnetic material underneath the structure such that the structured film has at least two different resonance frequencies.

BRIEF DESCRIPTION OF THE DRAWINGS

The present invention is explained in greater detail in the following with reference to an exemplary embodiment and drawings, in which.

DETAILED DESCRIPTION

Figure 1:
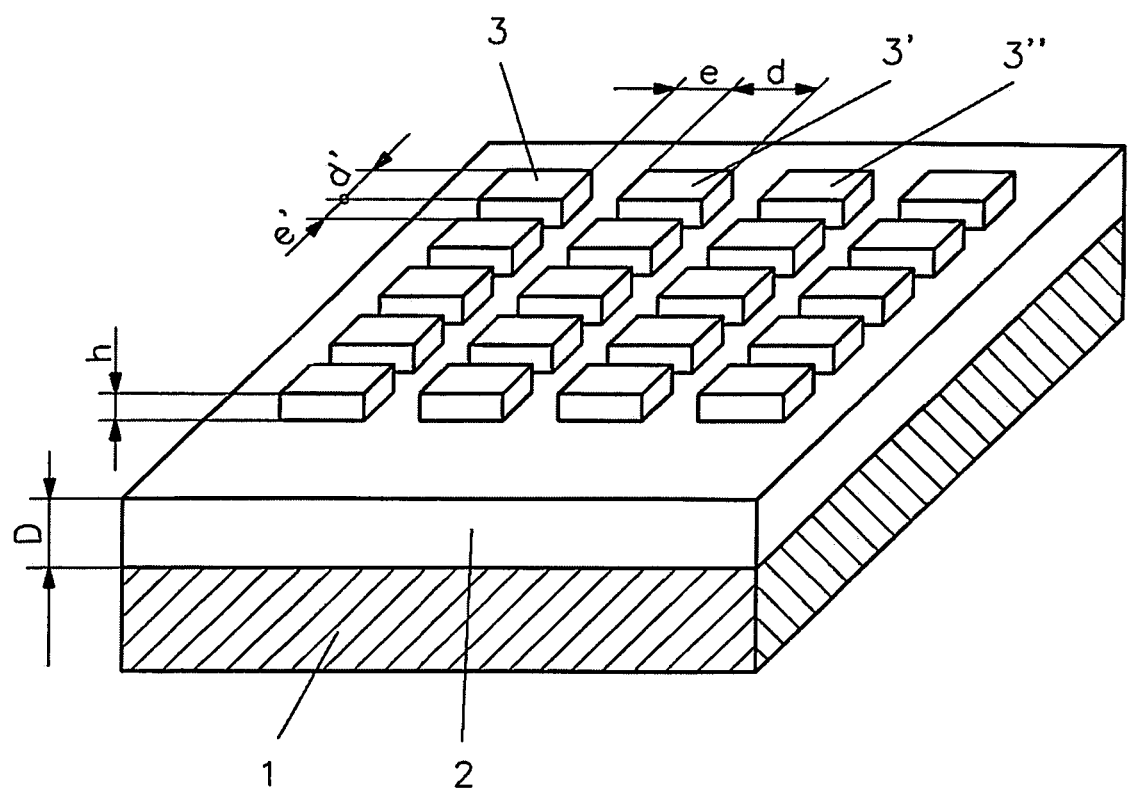
FIG. 1: is a schematic representation of an exemplary device according to the present invention.

A device according to the present invention is used for attenuating reflections of an electromagnetic wave which impinges thereon and which may have a frequency of between 1 MHz and 10 GHz, in particular between 250 MHz and 5 GHz.

A device according to the present invention is applied to a substrate. Any material is suited for this purpose, as long as a ferro- or ferrimagnetic material adheres thereto. Such a material includes a silicon wafer, for example, or the housing of an electronic component.

In an embodiment, the present invention is made of a uniform film of a ferro- or ferrimagnetic material having a thickness of preferably between 50 nm and 2 μm, particularly of between 200 nm and 1 μm. By properly selecting the ferro- or ferrimagnetic material and, if indicated, inducing a uniaxial anisotropy in the film plane, a first ferromagnetic resonance frequency is produced, which, with respect to resonance, effects an absorption of the electromagnetic energy in the material and conversion thereof into other energy forms, such as heat, discretely or over a frequency spectrum.

Moreover, in accordance with an embodiment of the present invention, this film is provided with a structure in such a way that a continuous film of the ferro- or ferrimagnetic material is formed underneath the entire structure. Due to the structuring, at least one further ferromagnetic resonance frequency is provided, which, with respect to resonance, likewise effects an absorption of the electromagnetic energy in the material and conversion thereof into other energy forms.

Thus, the structured film has at least two resonance frequencies which differ from one another.

A plurality of resonance frequencies are obtained by employing a film design that is tailored to a specific shielding problem. This makes it possible for a plurality of electromagnetic waves, each of a different frequency, to be reflection- or transmission attenuated.

In an embodiment, the structure is arranged in a periodic configuration in the film and preferably has a spacing period of between 10 µm and 250 µm, or in a more specific embodiment between 20 µm and 50 µm.

In an embodiment, the structure is composed of objects which have nearly the same dimensions and are disposed side-by-side. To this end, the film made of the ferro- or ferrimagnetic material is completely or partially structured to form micromagnetic objects, such as squares, rectangles, polygons, ellipses or circles. In this context, the selected domain structures may correspond to the desired frequency spectrum.

In another embodiment, objects of this kind are disposed side-by-side, each second adjacent object having nearly the same dimensions. A more universal application of this type of embodiment would provide for the structure to be composed of mutually adjacent objects, in each case, the n-th adjacent object having nearly the same dimensions and n optionally being a natural number between 2 and 20.

Using a thin film method, a ferro- or ferrimagnetic film according to the present invention can be applied as a single- or multi-layer film with or without uniaxial anisotropy, respectively with or without insulating or conductive intermediate films, to a substrate, for example to a wafer, or directly to a housing of an electronic component.

Microstructuring techniques are subsequently used to structure the film to form individual regions. The objects produced in this manner may have any given geometrical shapes and dimensions, such as square, rectangular, round, elliptical or annular, for example. To obtain a specific frequency spectrum, various films and geometries having different lateral dimensions are implemented and combined. In this context, both the shape of the domain structure, as well as the chemical composition of the film, determine the particular frequency and attenuation properties.

An aspect of the present invention is that, because of a lower multiple reflection, adjacent components are subject to less interference in response to the emission of electromagnetic waves by high-frequency components. Thus, the present invention makes it possible to adjust the frequency of the maximum attenuation, thereby suppressing or attenuating one or a plurality of the frequency ranges. In addition, a device according to the present invention may feature small dimensions and a low weight. Thus, a possible use of the present invention is to shield electronic components in the electronics, telecommunications, automotive and aviation industries over frequency ranges encompassing at least two resonance frequencies.

As shown schematically in FIG. 1, a commercial silicon wafer 1, provided on its surface with a 1 µm thick film of $SiO_2$, was used as a substrate. An approximately 300 nm thick film 2 of the ferromagnetic material FeCoTaN was applied thereto using magnetron sputtering.

Squares 3, 3', 3", ... configured side-by-side and having a lateral length of d=40 µm and spaced at a distance of e=5 µm were subsequently introduced into this film as a periodic structure having a spacing period of p=d+e=45 µm in the two mutually perpendicular directions by etching. The etching process was stopped when the squares 3, 3', 3", ... reached a height h of approximately 100 nm over the remaining film 2, which still had an approximate thickness D of 200 nm.

Figure 2:
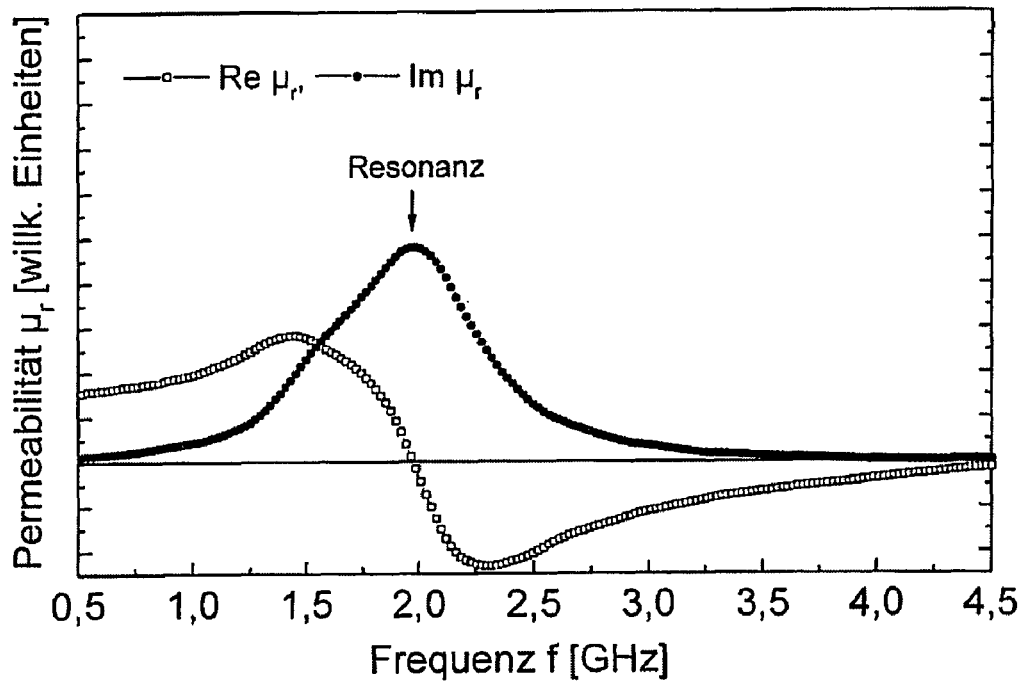
FIG. 2: shows the permeability as a function of the frequency of the unstructured film (comparative test)
Figure 3:
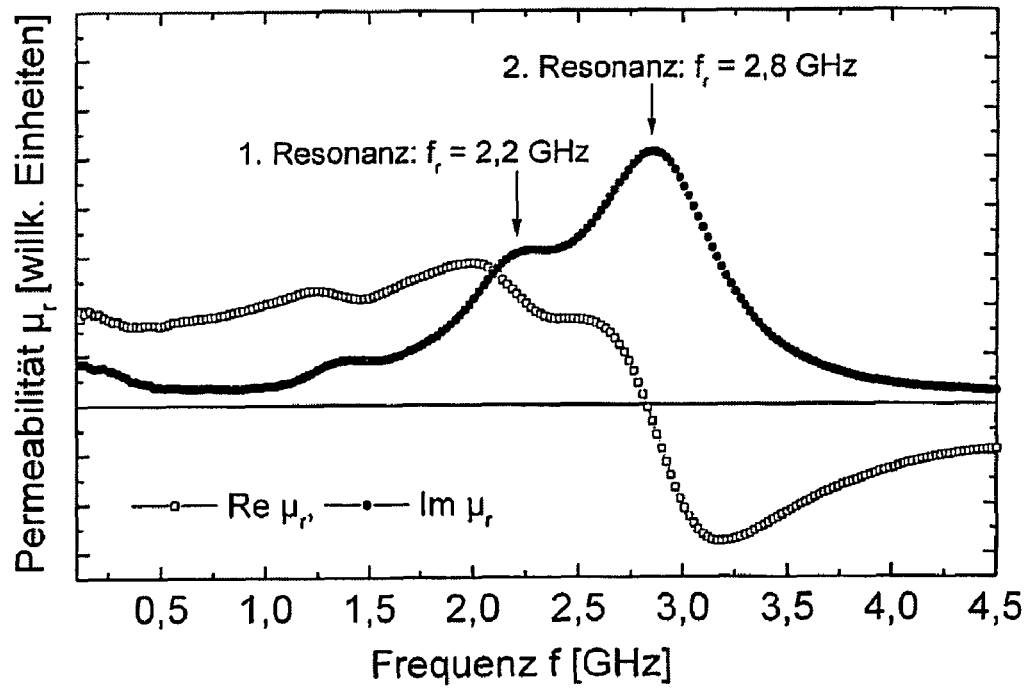
FIG. 3: shows the permeability as a function of the frequency of the structured film according to the present invention.

On the basis of the real part Re and imaginary part Im of permeability $\mu_r$ as a function of frequency f, the resonance frequencies of the ferromagnetic material were ascertained for film without and with structuring, shown in FIGS. 2 and 3, respectively. The functions illustrated in FIGS. 2 and 3 were recorded using a strip line permeameter.

As a comparative test, real part Re and imaginary part Im of permeability $\mu_r$ of the unstructured film are illustrated in FIG. 2 as a function of frequency f. In imaginary part Im, the maximum of the ferromagnetic resonance of film 2 is clearly discernible at a value of approximately 2 GHz.

FIG. 3 shows real part Re and imaginary part Im of permeability $\mu_r$ of the structured film produced in accordance with the present invention, as a function of frequency f. In imaginary part Im, the two maxima of the structured film are clearly evident at values of approximately 2.2 GHz and 2.8 GHz. While one maximum results from the ferromagnetic resonance of film 2, the second maximum is induced by the periodic structure introduced into the film. From this configuration of the maxima, an attenuation of reflections of an electromagnetic wave impinging on the device and having a frequency above a range of between approximately 1.5 GHz and approximately 3.5 GHz is derived.

The invention claimed is:

1. A device for attenuating reflections of an electromagnetic wave impinging thereon comprising:
    a structured film of a first material comprising at least one of a ferromagnetic and ferrimagnetic material, the structured film including a structured portion having periodically disposed micromagnetic objects of the first material and a uniform film portion of the first material underneath the structured portion such that the structured film has at least two different resonance frequencies.

2. The device as recited in claim 1 wherein the film is disposed on a substrate.

3. The device as recited in claim 1 wherein the structured portion includes a spacing period between 10 µm and 250 µm.

4. The device as recited in claim 3 wherein the structured portion includes a spacing period between 20 µm and 50 µm.

5. The device as recited in claim 3 wherein the micromagnetic objects are mutually adjacent objects having substantially same dimensions.

6. The device as recited in claim 1 wherein the film has a thickness between 50 nm and 2 µm.

7. The device as recited in claim 6 wherein the film has a thickness between 200 nm and 1 µm.

8. The device as recited in claim 1 wherein the device is operable to attenuate reflections of an electromagnetic wave having a frequency between 1 MHz and 10 GHz.

9. The device as recited in claim 8 wherein the device is operable to attenuate reflections of an electromagnetic wave having a frequency between 250 MHz and 5 GHz.

10. A method of manufacturing a device for attenuating reflections of an electromagnetic wave impinging thereon comprising:
    applying a film of a first material comprising at least one of a ferromagnetic and ferrimagnetic material to a substrate; and
    removing portions of the film so as to provide a structured film including a structured portion having periodically disposed micromagnetic objects of the first material and a uniform film portion of the first material underneath the structured portion such that the structured film has at least two resonance frequencies.

11. The method as recited in claim 10 wherein the substrate is part of a housing of an electronic component.

12. The method as recited in claim 10 wherein the structured portion includes a spacing period between 10 μm and 250 μm.

13. The method as recited in claim 10 wherein the structured portion includes a spacing period between 20 μm and 50 μm.

14. The method as recited in claim 10 wherein the film includes a thickness between 50 nm and 2 μm.

15. The method as recited in claim 10 wherein the film includes a thickness between 200 nm and 1 μm.

16. A method of shielding electronic components comprising:
    applying a film of a first material comprising at least one of a ferromagnetic and ferrimagnetic material to a housing of the electronic components; and
    removing portions of the film so as to provide a structured film including a structured portion having periodically disposed micromagnetic objects of the first material and a uniform film portion of the first material underneath the structured portion, such that the structured film has at least two resonance frequencies and is operable to attenuate reflections of an electromagnetic wave impinging thereon.

17. The method as recited in claim 16 wherein the film is applied to a substrate of the housing of the electronic components.

18. The method as recited in claim 16 wherein the removing portions of the film is performed so as to provide the periodically disposed micromagnetic objects with a spacing period between 10 μm and 250 μm.

19. The method as recited in claim 16 wherein the film includes a thickness between 50 nm and 2 μm.

20. The method as recited in claim 16 wherein the film includes a thickness between 200 nm and 1 μm.

\* \* \* \* \*